United States Patent [19]

Choquette

[11] Patent Number: 5,316,968
[45] Date of Patent: May 31, 1994

[54] METHOD OF MAKING SEMICONDUCTOR SURFACE EMITTING LASER

[75] Inventor: Kent D. Choquette, New Providence, N.J.

[73] Assignee: AT&T Bell Laboratories, Murray Hill, N.J.

[21] Appl. No.: 16,399

[22] Filed: Feb. 11, 1993

Related U.S. Application Data

[62] Division of Ser. No. 857,352, Mar. 25, 1992, Pat. No. 5,212,702.

[51] Int. Cl.⁵ ............................................. H01L 21/20
[52] U.S. Cl. ...................................... 437/105; 372/43; 372/45; 372/50; 372/92; 437/107; 437/126; 437/129; 437/133
[58] Field of Search ............... 437/129, 105, 107, 126, 437/136; 372/43, 45, 50, 92

[56] References Cited

U.S. PATENT DOCUMENTS

| 5,076,205 | 12/1991 | Vowles et al. | 156/345 |
| 5,136,603 | 8/1992 | Hasnain et al. | 372/50 |

FOREIGN PATENT DOCUMENTS

| 0321090 | 1/1991 | Japan | 372/46 |
| 0321091 | 1/1991 | Japan | 372/46 |

OTHER PUBLICATIONS

J. L. Jewell, et al. "Low-Threshold Electrically Pumped Vertical-Cavity Surface Emitting Microlasers", *Electron. Lett.* 25 pp. 1123-1124, (1989).

Y. H. Lee, et al. "Effects of Etch Depth and Ion Implantation on Surface Emitting Microlasers," *Electron. Lett.*, vol. 26, pp. 225-227, (1990).

H. Yoo, et al. "Fabrication of a Two-Dimensional Phased Array of Vertical-Cavity Surface-Emitting Lasers," *Appl. Phys. Lett.*, vol. 59, pp. 1198-1200, (1990).

R. S. Geels, et al. "Low Threshold Planarized Vertical-Cavity Surface Emitting Lasers," *IEEE Tech. Lett.*, vol. 2, pp. 234-236, (1990).

R. S. Geels, et al. "Submilliamp Threshold Vertical-Cavity Laser Diodes," *Appl. Phys. Lett.*, vol. 57, pp. 1605-1607, (1990).

Y. J. Yang, et al. "Low-Threshold Operation of a GaAs Single Quantum Well Mushroom Structure Surface-Emitting Laser," *Appl. Phys. Lett.*, vol. 58, p. 1780, (1991).

M. Ogura, et al. "Surface-Emitting Laser Diode with Vertical GaAs/GaAlAs Quarter-Wavelength Multilayers and Lateral Buried Heterostructure", *Appl. Phys. Lett.* vol. 51, pp. 1655-1657, (1987).

A. Ibaraki, et al. "Buried Heterostructure GaAs/GaAlAs Distributed Bragg Reflector Surface Emitting Laser with Very Low Threshold (5.2 mA) under Room temperature CW Conditions," *Jpn. J. Appl. Phys.* vol. 28, L. 667-L 668 (1989).

F. Koyama, et al. "Room Temperature Continuous Wave Lasing Characteristics of a GaAs Vertical Cavity Surface-Emitting Laser," *Appl. Phys. Lett.* vol. 55, pp. 221-222, (1989).

M. Ogura, et al. "Surface-Emitting Laser Diode with Distributed Bragg Reflector and Buried Heterostruc- (List continued on next page.)

*Primary Examiner*—Olik Chaudhuri
*Assistant Examiner*—Ramamohan Rao Paladugu
*Attorney, Agent, or Firm*—Glen E. Books

[57] ABSTRACT

The present applicant has discovered that one can make a surface emitting laser with enhanced operating characteristics by etching away the outer reflector stack peripheral to the intended active area and protecting the reflector stack mesa remaining over the active area by in situ metalization in high vacuum. The active area can be isolated, as by ion implantation, providing an electrical path through the active region free of the outer reflector stack. The result is a surface emitting laser having reduced series resistance. The device lases at lower voltage and provides an enhanced intensity of optical output as compared with conventional planar devices.

10 Claims, 3 Drawing Sheets

OTHER PUBLICATIONS ture," *Electron. Lett.* vol. 26, pp. 18–19, (1990).

M. Shimada, et al. "Low-Threshold Surface-Emitting Laser Diodes with Distributed Bragg Reflectors and Current Blocking Layers," *Appl. Phys. Lett.* vol. 57, pp. 1289–1291, (1990).

A. Ibaraki, et al. "GaAs Buried Heterostructure Vertical Cavity Top-Surface Emitting Lasers," *IEEE J. Quan. Electron,* vol. 27, p. 1386 (1991).

R. P. H. Chang, et al. "Hydrogen Plasma Etching of GaAs oxide,"*Appl. Phys. Lett.* 38, pp. 898–900, (1981).

P. Friedel, et al. "Interactions Between $H_2$ and $N_2$ Plasmas and a GaAs(100) Surface: Chemical and Electronic Properites," *Appl. Phys. Lett.,* vol. 42, pp. 509–511, (1983).

K. Asakawa, et al. "Damage and Contamination-Free GaAs and AlGaAs Etching Using a Novel Ultrahigh-Vacuum Reactive Ion Beam Etching System with Etched Surface Monitoring and Cleaning Method," *J. Vac. Sci. Techno.,* A4, p. 677 (1986).

S. Sugata, et al. "GaAs Cleaning with a Hydrogen Radical Beam Gun in an Ultrahigh-Vacuum System," *J. Vac. Sci. Technol.* B6, pp. 1087–1091, (1988).

N. Kondo et al. "Low-Temperature Surface Cleaning of GaAs by Electron Cyclotron Resonance (ECR) Plasma," *Jpn. J. Appl. Phys.* vol. 28, L7 (1989).

S. V. Hattangady, et al. "In Situ Cleaning of GaAs Surfaces Using Hydrogen Dissociated With a Remote Noble-Gas Discharge," *j. Appl. Phys.* vol. 68, pp. 1233–1236, (1990).

METHOD OF MAKING SEMICONDUCTOR SURFACE EMITTING LASER

This is a division of application Ser. No. 07/857,352 filed Mar. 25, 1992 now U.S. Pat. No. 5,212,702.

FIELD OF THE INVENTION

This invention relates to semiconductor lasers and, in particular, to a semiconductor vertical cavity surface emitting laser having reduced threshold voltage and enhanced optical output. A method for making such a laser is also described.

BACKGROUND OF THE INVENTION

Semiconductor lasers are attractive for a wide variety of applications including telecommunications, computing systems, optical recording systems and optical interconnection of integrated circuits. Semiconductor lasers provide compact sources of coherent, monochromatic light which can be modulated at high bit rates to transmit large amounts of information.

Vertical-cavity surface emitting lasers (VCSELs) are particularly promising for applications requiring two dimensional arrays of lasers. As contrasted with edge emitting lasers which emit light parallel to the growth planes of their substrates, VCSELs emit perpendicular to the substrates. A typical VCSEL comprises an active region sandwiched between a pair of distributed Bragg reflector stacks. Upon injection of suitable current through the active region, laser light is emitted transverse to the planes of growth.

One difficulty with conventional VCSELs is their relatively low efficiency. Much of the electrical power passing through the resistive reflector stacks is wasted in generating heat rather than light, and the heat generated degrades the operating characteristics of the device. Accordingly, there is a need for a VCSEL device having reduced electrical resistance and providing enhanced optical output.

SUMMARY OF THE INVENTION

The present applicant has discovered that one can make a surface emitting laser with enhanced operating characteristics by etching away the outer reflector stack peripheral to the intended active area and protecting the reflector stack mesa remaining over the active area by in situ metalization in high vacuum. The active area can be isolated, as by ion implantation, providing an electrical path through the active region free of the outer reflector stack. The result is a surface emitting laser having reduced series resistance. The device lases at lower voltage and provides an enhanced intensity of optical output as compared with conventional planar devices.

BRIEF DESCRIPTION OF THE DRAWING

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for the graphical illustration, are not to scale.

DETAILED DESCRIPTION

Figure 1:
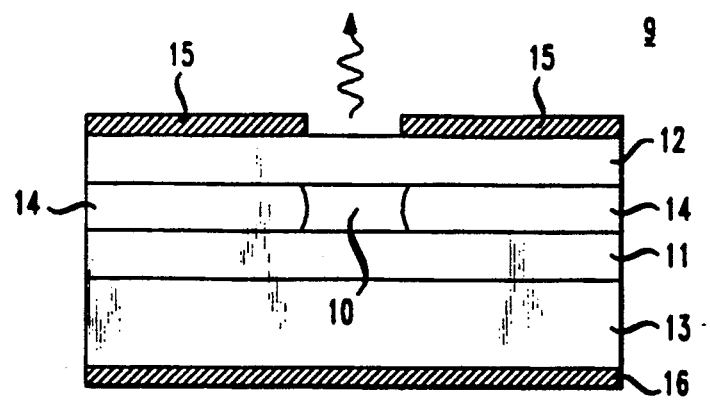
FIG. 1 is a schematic cross section of a conventional planar surface emitting laser useful in explaining the problem to which the present invention is directed.

Referring to the drawing, FIG. 1 is a schematic cross section of a conventional surface emitting laser 9 comprising, in essence, an active region 10 disposed between a pair of distributed Bragg reflector stacks 11 and 12. The structure is typically fabricated on a semiconductor substrate 13 such as n-type gallium arsenide. The inner reflector stack 11 comprises periodic layers such as layers of aluminum gallium arsenide and aluminum arsenide. The layers of inner stack 11 are doped with the same type impurity as the substrate. The active region 10 typically comprises alternating barrier layers and quantum well layers such as alternating layers of aluminum gallium arsenide and gallium arsenide. Alternatively, the active region can be a GaAs heterostructure. The outer reflector stack 12 is made up of periodic layers such as p-type aluminum gallium arsenide and aluminum arsenide. Regions 14 of the well layers peripheral to active region 10 are rendered nonconductive as by ion implantation to make them highly resistive, and ohmic contacts 15 and 16 are made to the outer stack 12 and the substrate 13, respectively, in order to provide current to the active region.

In operation of the conventional device, voltage applied between contacts 15 and 16 produces a current between them which is channeled by implantation regions 14 through active region 10. Light generated in the active region is reflected between stacks 11 and 12 with a portion typically emitted through outer stack 12. Since the direction of light emission is perpendicular to the growth planes, the structure is referred to as a vertical cavity surface emitting laser.

One difficulty with this conventional structure is that outer stack 12 is disposed in the electrical path between contact 15 and active region 10. Stack 12 is resistive. Consequently, the threshold voltage required for lasing is increased, efficiency of conversion to optical energy is reduced, and the structure is heated by resistive power dissipation with consequent degradation of laser performance.

Figure 2:
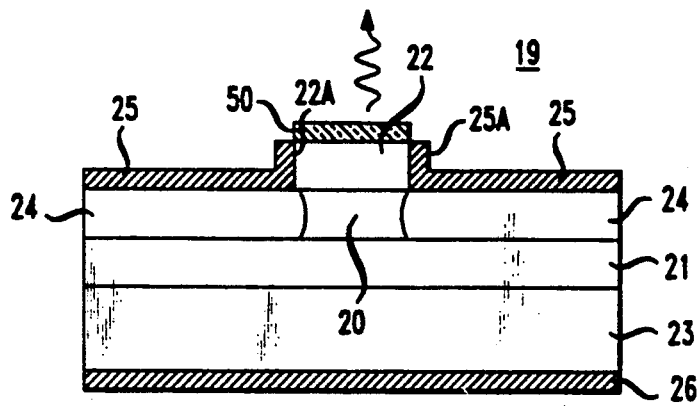
FIG. 2 is a schematic cross section of a surface emitting laser in accordance with the invention.

FIG. 2 is a cross section of a surface emitting laser 19 formed on substrate 23 in accordance with the invention. This structure comprises an active region 20 disposed between a pair of reflective stacks 21 and 22. However, in the FIG. 2 structure, the portions of the outer stack 22 peripheral to the active region 20 have been etched away leaving walls 22A, and a metal layer such as a portion 25A of ohmic contact 25 is disposed on the walls 22A of the outer stack. Regions 24 of the layers peripheral to active region 20 are rendered nonconductive or resistive as by ion implantation. Thus current between ohmic contacts 25 and 26 is channeled through active region 20. With this structure there is an electrical path between the outer ohmic contact 25 and the active region 20 which does not pass through outer stack 22. The electrical path can be further enhanced by adding a thick, doped contact layer (not shown) between the active region and the outer reflecting stack.

Figure 3:
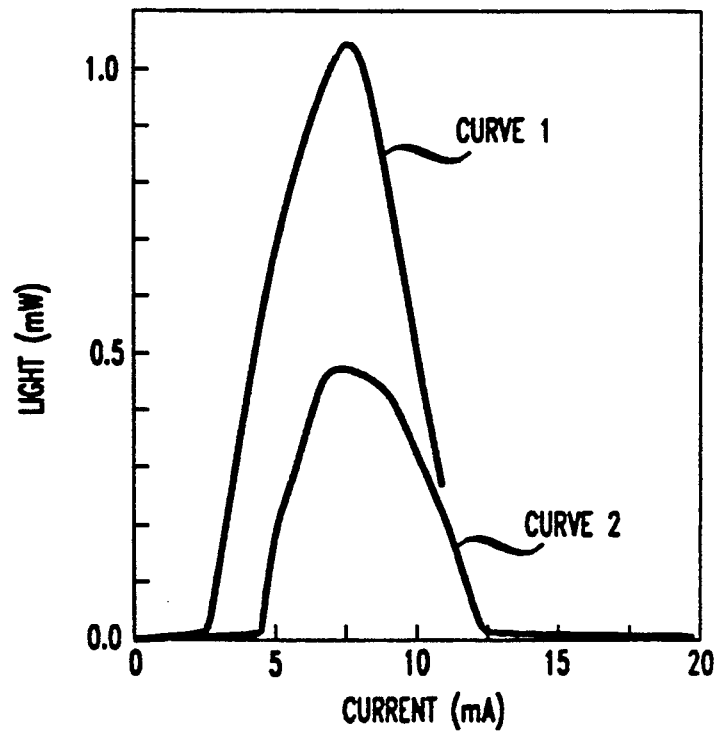
FIG. 3 is a graphical plot of the lasing characteristics of the device of FIG. 2 in comparison with those of a similar conventional device.

The result is a substantial enhancement of the optical characteristics of the surface emitting laser. FIG. 3, curve 1, is a graphical illustration of the continuous-wave output power versus current of a FIG. 2 device and curve 2 is the output power for a conventional FIG. 1 device made from the same workpiece. As can be seen, the FIG. 2 device begins lasing at a lower threshold voltage and generates over twice the maximum optical output at the same current level.

Figure 4:
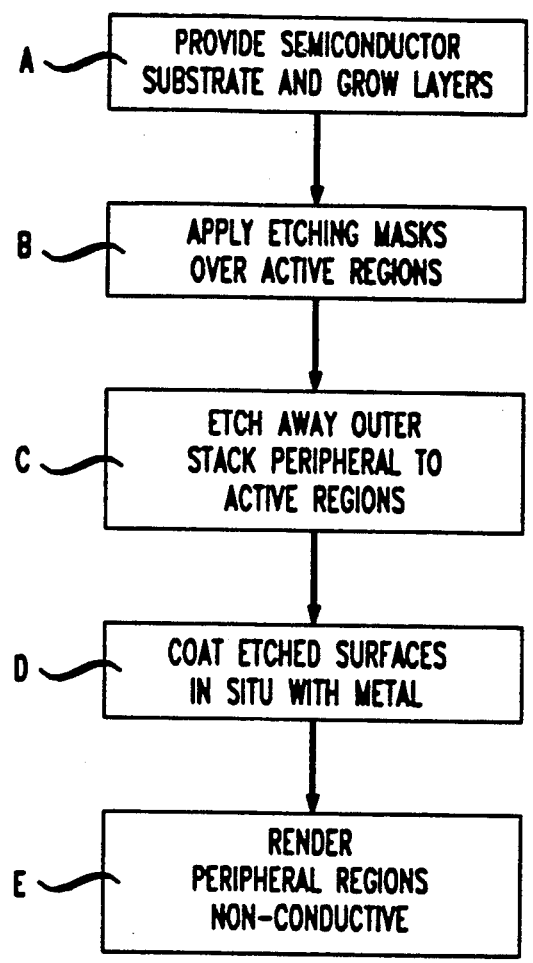
FIG. 4 is a block diagram illustrating the steps of the preferred process for making the structure of FIG. 2.
Figure 5:
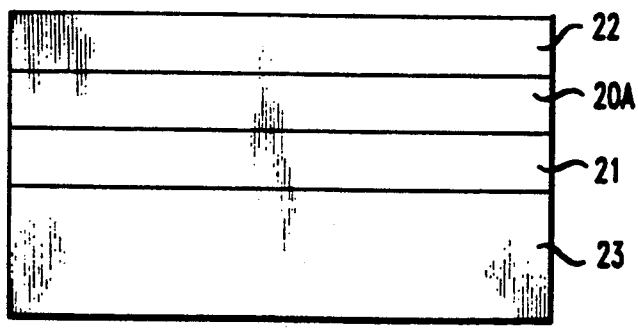
FIGS. 5-8 illustrate a substrate at various steps in the fabrication process of FIG. 4.

The preferred method for making the structure of FIG. 2 can be understood by reference to FIG. 4, which is a block diagram showing the steps of the preferred process, and FIGS. 5–8, which show a substrate at various stages of the process. As shown in FIG. 4A, the initial steps involve providing a semiconductor substrate 23 and epitaxially growing on the substrate the series of layers forming the inner reflector stack 21, the active region layers 20A and the outer reflector stack 22. The resulting structure is schematically shown in FIG. 5. These layers can be formed using molecular beam epitaxy (MBE) in accordance with techniques well known in the art.

Figure 6:
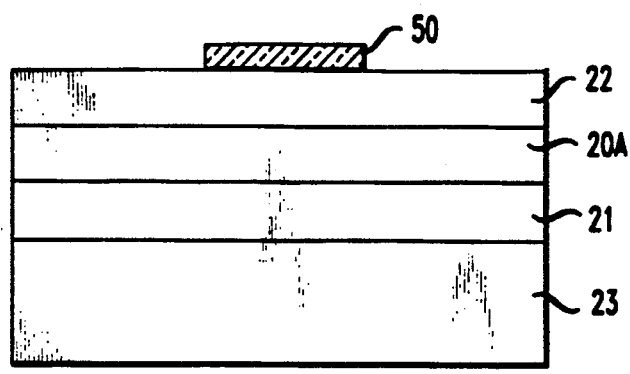

The next step shown in FIG. 4B is to provide the outer surface of the substrate with an etching mask 50 selectively overlying the area where active region 20 of the laser is to be formed. The structure is shown in FIG. 6. The mask 50 can be a 10–20 micrometer diameter dot of silicon dioxide 3000–6000 Å thick formed by plasma-enhanced chemical vapor deposition and patterned in accordance with photolithographic techniques well known in the art. A silicon dioxide mask not only provides for definition of the laser active area during fabrication but also provides transparent protective layer over the laser facet after fabrication. Preferably, its thickness is chosen to act as a half wave plate for the laser wavelength.

Figure 7:
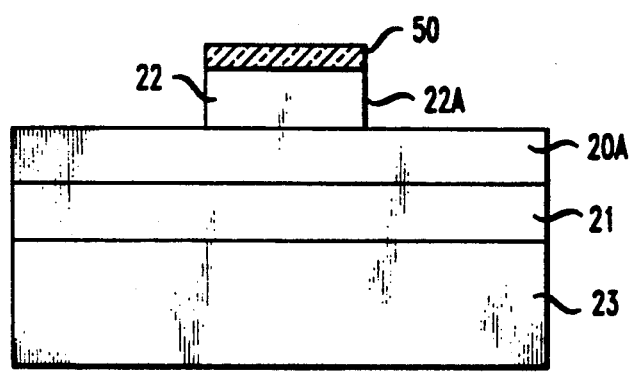

The third step illustrated in FIG. 4C is selectively etching away the outer stack in regions peripheral to the active region. As shown in FIG. 7, this leaves the portion of the outer stack 22 overlying the active region and exposes walls 22A. Preferably the etching is effected by dry etching under conditions producing non-selective, low damage, anisotropic etching.

During the etching step, depth should be closely monitored to ensure that etching is stopped before penetration into the active region 20. Accurate depth monitoring during etching can be accomplished by laser reflectometry.

Figure 8:
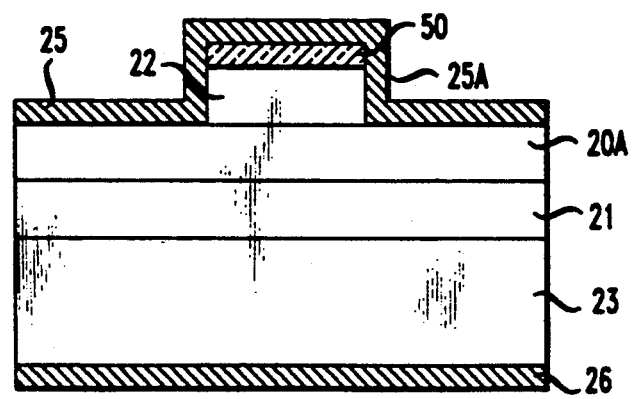

The next step shown in FIG. 4D is—without exposing the substrate to atmosphere—to deposit in situ a thin layer of metal 25, 25A on the etched surface including the exposed walls 22A. A thin layer of metal, such as 1300 Å of gold or gold alloy, is deposited on the substrate. The in situ deposited epitaxial gold layer ensures good electrical contact. The side wall coverage 25A encapsulates the exposed AlGaAs and AlAs layers of the outer stack, eliminating potential contamination and corrosion problems. The lower contact 26 can be deposited in the conventional manner. The resulting structure is shown in FIG. 8.

An alternative process does not require maintenance of high vacuum prior to metallization, but rather uses hydrogen plasma cleaning prior to regrowth. Assuming atmospheric exposure after the etching step, the substrates are introduced into an electron cyclotron resonance (ECR) chamber for hydrogen plasma processing, and oriented at approximately 80° from normal incidence to the ECR source. The substrate is heated to approximately 300° C., hydrogen gas is introduced at a flow rate of 10–20 SCCM to give a working pressure of $1-2\times10^{-4}$ Torr, and microwave power is varied between 100 and 200 watts for 30–60 minutes. After plasma processing, the substrates are transferred in vacuum to another chamber where they are heated to 250°–500° C. for 20 minutes to remove any residual physisorbed gas or reaction products and to anneal the surface. The samples are then moved in vacuum to a chamber for metallization as described above.

The fifth step illustrated in FIG. 4E is to make nonconductive the portions of layer 20A peripheral to the active region 20 so that current is laterally confined to the active region. After the etching and metallization steps of FIGS. 4C and 4D, this current confinement can be achieved by O+ implantation carried out with the SiO2 etch masks still in place. Alternatively, the portions can be made nonconductive prior to the etching step of FIG. 4C by proton implantation. Because of the aligning effect of mask 50, the walls 22A are within 10 micrometers of the periphery of active region 20.

As final steps (not shown), the gold can be selectively removed from the top of stack 22. Using conventional photolithographic techniques, the portions of the laser peripheral to the etch masks 50 are covered with resist while leaving unprotected the gold over masks 50. The gold is then removed as by argon milling or chemical etching. The underlying SiO2 layer 50 acts as an etch stop, and the residual SiO2 layer is left on the laser to act as transparent protective layer over the top facet. As a final step the individual lasers can be isolated by deep trenches. The result is the device shown in FIG. 2.

The structure, fabrication and operation of the invention can be understood in greater detail by consideration of the following specific example of fabrication of such a device. The first step is to provide a substrate 23 of n-doped gallium arsenide and to grow by MBE the sequence of layers comprising the FIG. 2 device, including the bottom reflector stack 21, the quantum well active region 20, and the upper reflector stack 22.

The bottom reflector stack 21 is fabricated by growing a staircase distributed Bragg reflector comprising thirty periods of layers. Each period consists of 515 Å of $Al_{0.16}Ga_{0.84}As$, 99 Å of $Al_{0.58}Ga_{0.42}As$, 604 Å of AlAs, and 99 Å of $Al_{0.58}Ga_{0.42}As$. The AlGaAs layers are doped with n-type impurity, e.g. silicon, to a concentration of $3\times10^{18}$ cm$^{-3}$.

The active region 20 is grown by MBE on the lower reflector stack 21. As a preliminary step, a spacer layer of $Al_{0.16}Ga_{0.84}As$ is grown on stack 21. The thickness of the spacer layers is preferably chosen so that the central antinode of standing waves will overlap the quantum wells. In this example, the thickness is about 890 Å. The quantum well region on the spacer layer comprises five quantum wells consisting of 70 Å well layers of GaAs and 70 Å barrier layers of $Al_{0.16}Ga_{0.84}As$. A second 890 Å $Al_{0.16}Ga_{0.84}As$ spacer layer is grown over the region. The two spacer layers sandwich the quantum well active region to form a confinement heterostructure for efficient carrier trapping.

The upper reflector stack 22 is grown on the quantum well active region 20, and in particular, on the upper spacer layer of region 20. The upper stack 22 is similar to the lower stack 23 except that stack 22 is p-doped and contains fewer periods than stack 23 so that light will be emitted. Specifically, stack 22 can be doped with Be to a concentration of $3 \times 10^{-18} cm^{-3}$ and comprise 20 periods.

After material growth, a layer of $SiO_2$ is deposited, preferably by plasma-enhanced chemical vapor deposition, to a thickness of 3000 Å. The thickness is chosen to be equal to a half wavelength to insure efficient light emission. Circular photoresist dots with 16 μm diameter and 6 μm thick are photolithographically defined. This photoresist mask acts as an ion implantation mask as well as a mask for $SiO_2$ patterning. The sample may now be subjected to proton implantation to confine current to the region underlying the ring. Using $H^+$ at an energy of 280 ke V and a dose of $3 \times 10^{14} cm^{-2}$ produces an ion displacement profile peaked at a depth of 2.5 μm. The result is a highly resistive buried layer formed by implant damage which funnels the current. Following the ion implantation, the same photoresist mask is used as an etch mask to plasma etch the $SiO_2$ to form the laser etching mask.

The sample can now be dry etched, preferably by electron cyclotron resonance plasma etching using $SiCl_4$ at a pressure of $1 \times 10^{-3}$ Torr and microwave power of 400 W at 2.54 GHz. The etch is monitored in real time by measuring the reflected intensity of a red laser beam from the sample surface. The laser intensity varies as the etch proceeds through the outer stack, corresponding to the change of reflectance from the AlGaAs and AlAs layers. In this manner it is possible to stop precisely after the last AlAs layer is etched away in the outer stack, leaving the outer confinement layer exposed.

The sample is then transferred in a vacuum of $2 \times 10^{-10}$ Torr to a metallization MBE system. The exposed layers are not subjected to atmospheric exposure in order to avoid oxide formation on the highly reactive AlGaAs surfaces. The sample is annealed at 250°-500° C. for 20 minutes to desorb any reaction products on the etched surface. The substrate temperature is reduced to 100° C., and Au is deposited from an effusion cell where the sample is oriented at an angle and is rotated to insure sidewall coverage. After 400 Å of epitaxial Au is deposited, the sample is removed from the metallization chamber, transported to another deposition system in air, and an additional 1000 Å of Au is angle evaporated by e-beam deposition.

As an alternative to proton implantation, at this point $O^+$ implantation can be utilized to create current funneling. A double oxygen implant at 300 and 600 Ke V, each at a dose of $5 \times 10^{12} cm^{-2}$, produces a 0.5 μm nonconductive region under the contact. The etched mirror stack acts as an ion mask, giving a self-aligned implantation process.

Next the Au is removed from the top of the laser to allow light emission. A photoresist mask is produced which only exposes the $SiO_2$ circular dots on top of the etched mirror stack 22. $Ar^+$ milling is used to remove the gold on top of the $SiO_2$ mask. The final step is forming an ohmic contact 26 with the n-doped gallium arsenide substrate 23, as by alloying the substrate with indium to a copper heat sink (not shown). The device is now ready for testing and operation.

It is to be understood that the above-described embodiments are illustrative of only some of the many possible specific embodiments which can represent applications of the principles of the invention. For example, while the invention has been described in the context of a preferred gallium arsenide materials system, other compound semiconductor materials systems such as indium phosphide and gallium antimonide can also be used. Thus numerous and varied other arrangements can be made by those skilled in the art without departing from the spirit and scope of the invention.

I claim:

1. A method for making a semiconductor device comprising an active region peripherally surrounded with metal comprising the steps of:
   providing a semiconductor substrate;
   growing on said substrate an active layer for forming said active region;
   growing a resistive layer overlying said active layer;
   etching away a portion of said resistive layer peripherally surrounding said active region in a reduced pressure environment thereby exposing a lateral edge of said resistive layer; and
   without exposing the etched substrate to atmosphere, covering with metal the etched surface of said substrate including said lateral edge of said resistive layer.

2. The method of claim 1, wherein said active region is a quantum well active region.

3. The method of claim 1, wherein said metal comprises gold.

4. A method for making a semiconductor device comprising an active region peripherally surrounded with metal comprising the steps of:
   providing a semiconductor substrate;
   growing on said substrate an active layer for forming said active region;
   growing a resistive layer overlying said active layer;
   etching away a portion of said resistive layer peripherally surrounding said active region thereby exposing a lateral edge of said resistive layer;
   exposing the etched substrate to a gas plasma comprising hydrogen, and
   without exposing the plasma treated surface to atmosphere, covering with metal the etched surface of said substrate including said lateral edge of said resistive layer.

5. The method of claim 4, wherein said active region is a quantum well active region.

6. The method of claim 4, wherein said metal comprises gold.

7. A method of making a semiconductor vertical cavity surface emitting laser comprising the steps of:
   providing a semiconductor substrate;
   growing on said substrate a series of layers for forming an inner reflector stack, an active region, and an outer reflector stack;
   etching away portions of said outer reflector stack peripheral to said active region in a reduced pressure environment thereby exposing a lateral edge of said outer reflector stack;
   without exposing the etched substrate to atmosphere, depositing a layer of metal over the etched surface including said lateral edge of said outer reflector stack; and
   removing metal over the active region.

8. The method of claim 7, wherein said substrate comprises gallium arsenide, said reflector stacks comprise aluminum gallium arsenide, said active region comprises gallium arsenide, said mask comprises silicon dioxide and said metal comprises gold.

9. A method of making a semiconductor vertical cavity surface emitting laser comprising the steps of:
   providing a semiconductor substrate;

growing on said substrate a series of layers for forming an inner reflector stack, an active region, and an outer reflector stack;

etching away portions of said outer reflector stack peripheral to said active region thereby exposing a lateral edge of said outer reflector stack;

exposing the etched substrate to a gas plasma comprising hydrogen in a reduced pressure environment, and without exposing the etched substrate to atmosphere, covering with metal the etched surface of said substrate, including said lateral edge of said outer reflector stack.

10. The method of claim 9, wherein said substrate comprises gallium arsenide, said reflector stacks comprise aluminum gallium arsenide, said active region comprises gallium arsenide, said mask comprises silicon dioxide and said metal comprises gold.

* * * * *